(12) United States Patent
Nakayoshi

(10) Patent No.: US 6,517,667 B1
(45) Date of Patent: Feb. 11, 2003

(54) APPARATUS FOR POLISHING A SEMICONDUCTOR WAFER

(75) Inventor: Yuichi Nakayoshi, Miyazaki (JP)

(73) Assignee: Komatsu Electronic Metals Co., Ltd., Kanagawa (JP)

(*) Notice: Subject to any disclaimer, the term of this patent is extended or adjusted under 35 U.S.C. 154(b) by 0 days.

(21) Appl. No.: 09/098,712

(22) Filed: Jun. 17, 1998

(30) Foreign Application Priority Data

Jun. 19, 1997 (JP) .............................................. 9-162188

(51) Int. Cl.⁷ .................................................. C23F 1/00
(52) U.S. Cl. .............................. 156/345.12; 156/345.11; 451/285; 451/286; 451/287; 451/288; 451/289
(58) Field of Search ................... 118/500; 451/285–289; 156/345

(56) References Cited

U.S. PATENT DOCUMENTS

| | | | | |
|---|---|---|---|---|
| 4,270,316 A | * | 6/1981 | Kramer et al. ................. | 451/41 |
| 4,504,699 A | * | 3/1985 | Dones et al. .............. | 174/84 R |
| 5,257,478 A | * | 11/1993 | Hyde et al. ................. | 51/131.5 |
| 5,318,156 A | * | 6/1994 | Davis .......................... | 188/298 |
| 5,514,025 A | * | 5/1996 | Hasegawa et al. ............. | 451/44 |
| 5,643,061 A | * | 7/1997 | Jackson et al. .............. | 451/289 |
| 5,670,011 A | * | 9/1997 | Togawa et al. .............. | 156/345 |
| 5,679,610 A | * | 10/1997 | Matsuda et al. .............. | 438/584 |
| 5,762,544 A | * | 6/1998 | Zuniga et al. .............. | 451/285 |
| 5,918,862 A | * | 7/1999 | Nelson ....................... | 267/64.23 |
| 6,024,630 A | * | 2/2000 | Shendon et al. .............. | 451/41 |
| 6,261,151 B1 | * | 7/2001 | Sandhu et al. | |

* cited by examiner

Primary Examiner—Gregory Mills
Assistant Examiner—Karla Moore

(57) ABSTRACT

An polishing apparatus consists of a piston which is fixed to the rotation axis, a ceramic plate which is oppositely arranged against the piston via a silicone gel, and a cylinder which houses these components. The wafer is attached on the bottom surface of a backing pad, and will be pressed and rotated by the piston in order to polish the surface thereof.

14 Claims, 3 Drawing Sheets

APPARATUS FOR POLISHING A SEMICONDUCTOR WAFER

BACKGROUND OF THE INVENTION

1. Field of the Invention

This invention relates to an apparatus for polishing a semiconductor wafer, and especially relates to an apparatus for polishing a semiconductor wafer which is effective to polish uniformly the surface of the wafer with a simple structure.

2. Description of the Prior Art

Conventionally, polishing a semiconductor wafer is conducted according to the following procedure.
1) A semiconductor wafer is contacted to a polishing cloth with a polishing liquid therebetween.
2) The semiconductor wafer is pressed against the polishing cloth by applying a pressure to the semiconductor wafer.
3) The semiconductor wafer is rotated in a state where the pressure is applied.

It is known that the apparatus having the following construction to carry out a series of the above procedure.
1) A disk having a larger diameter than the diameter of the semiconductor wafer.
2) A rotation axis fixed to the center of the disk.
3) A mechanism to press the semiconductor wafer with the bottom surface of the disk by supplying the rotation axis with a driving force.

However, the pressure generated by the driving force concentrates on the vicinity of the center of the disk because the pressure is applied to the disk through the rotation axis. Therefore, the pressure distribution applied from the disk to the wafer is uneven, as a result of which there is a problem that the irregularity occurs on the polishing surface of the wafer.

Unexamined Japanese Patent Publication No. H6-15563 and No. H5-69314 disclose the technologies which are known to solve this problem. In this conventional technologies, the fluid is supplied between the wafer and the disk. Therefore the mechanism for supplying the fluid must be installed in the conventional polishing apparatus.

However, the mechanism to supply the fluid has a complex structure in general. Furthermore, where the disk fixed to the rotation axis is rotated at the high speed, it is difficult to supply the fluid.

SUMMARY OF THE INVENTION

An object of this invention is to provide an apparatus for polishing a semiconductor wafer which is effective to polish uniformly the surface of the wafer with a simple structure.

To achieve the above object, this invention is created by paying attention to the aspect that the fluid is housed in the piston structure.

According to this invention, the pressure can be distributed uniformly in the fluid. Consequently, the surface of the wafer is pushed with a uniform pressure.

As a result, the surface of the polished wafer becomes flat.

BRIEF DESCRIPTION OF THE DRAWINGS

The various features of novelty which characterize this invention are pointed out with particularity in the claims annexed to and forming a part of this specification. For a better understanding of this invention, its operating advantages, and specific objects attained by its use, reference should be had to the accompanying drawing and descriptive matter in which there is illustrated and described a preferred embodiment of this invention.

This invention disclosed herein will be understood better with reference to the following drawings of which.

DETAILED DESCRIPTION OF THE INVENTION (The First Mode)

Figure 1:
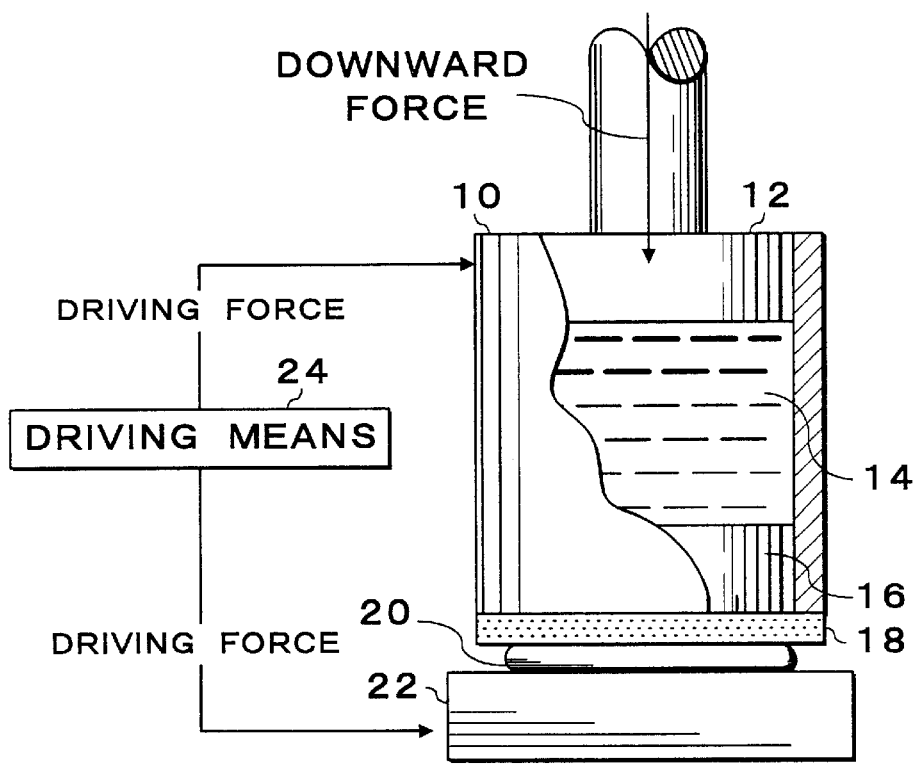
FIG. 1 is a conception diagram which shows the construction of the apparatus for polishing a semiconductor wafer in accordance with the first mode of this invention.

FIG. 1 is a conception diagram which shows the construction of the apparatus for polishing a semiconductor wafer in accordance with the first mode of this invention. The construction of the apparatus for polishing a semiconductor wafer in accordance with the first mode of this invention can be understood by explaining the following respective features of the first mode of this invention.

A housing member 10 is a member which houses a fluid 14 in combination with a pressing member 12 and a supporting member 16. It is desirable that the housing member 10 is formed in the cylindrical shape as shown in this figure. Preferably, the inner diameter of the housing member 10 is formed larger than that of a wafer 20.

A pressing member 12 is a member which applies a pressure from the upper side to the fluid 14. This pressing member 12 is arranged within the housing member 10 so as to slide along the inner wall of the housing member 10. A seal material such as cylinder rings is installed around the contact surface between the pressing member 12 and the housing member 10 in the case that the viscosity of the fluid 14 is low. Accordingly, the fluid 14 is sealed up. It is preferred that the pressing member 12 is made of a rigid material such as stainless steel to endure the pressure from the downward force.

A supporting member 16 is a member which supports the fluid 14 pressed by the pressing member 12 from the lower side. As shown in this figure, this supporting member 16 is arranged in the opposite side to the pressing member 12. The supporting member 16 is preferably made of ceramic because it has small thermal expansion and the corrosion proof property against alkali. Moreover, ceramic is a desirable material because a desired machining accuracy can be easily achieved.

The fluid 14 is a material to distribute the applied pressure from the pressing member 12 uniformly along the surface of the wafer 20. As shown in this figure, this fluid 14 is housed within the housing member 10 in a state where it is located between the pressing member 12 and the supporting member 16. The reason for the fluid 14 is arranged between the pressing member 12 and the supporting member 16 is as follows. That is, when the downward force is applied from the upper side to at least a part of the pressing member 12, when the pressing member 12 is lowered. Suppose that this downward force is applied to the pressing member 12 via a shaft fixed on the upper surface of the pressing member 12 as shown in this figure. As a result, a pressure applied to an under positioning member from the pressing member 12 concentrates in the vicinity of the shaft. Because the concentrated force forms an irregular polishing surface on the wafer 20, the downward force should be distribute uniformly along the whole surface of the wafer 20.

This invention utilized Pascal's principle so as to achieve uniform distribution of the pressure applied from the pressing member 12.

In view of the above aspect, the fluid 14 is arranged below the pressing member 12. Therefore liquid or gas to which can Pascal's principle is applied is used as the fluid 14 in this invention. Preferably, a fluid which has high viscosity such as silicone oil or liquid silicone rubber is used as the fluid 14. A low volatile fluid which can be safely treated is more preferable.

The straight silicone oil such as dimethyl silicone oil, the deformation silicone oil such as alkyl silicone oil, or the additive agent silicone oil which is produced by adding a heat-resistant to the straight silicone oil or the deformation silicone oil can be used as the above-mentioned silicone oil. Preferably, the silicone oil having the viscosity in the range of 10–1,000 cst (0.01 cm$^2$/sec), more preferably 10–100 cst, at the standard temperature is used.

The liquid polymer system can be used as the liquid silicone rubber. Preferably, the liquid silicone rubber having the viscosity in the range of 1,000–8,000 poise (g/cm·sec), more preferably 1,500–5,000 poise, is used.

A wafer holding member 18 is a member which holds the wafer 20. This wafer holding member 18 is arranged on the bottom surface of the housing member 10 and formed with soft material. A member to which the wafer 20 is attached with the rear surface thereof by the surface tension or by the adhesive can be used as the wafer holding member 18. It is desirable to use the backing pad as the wafer holding member 18. Moreover, a material such as a templates which prevent the wafer 20 from siding when polishing is carried out may be installed in this wafer holding member 18.

A polishing member 22 is a member which polishes the surface of the wafer 20. Preferably, this polishing member 22 consists of a polishing cloth and a polishing material such as the polishing liquid. Moreover, in view of utilizing Pascal's principle, it is desirable that the polishing surface of the polishing member 22 and the supporting surface of the supporting member 16 are flat and parallel with each other.

A driving means 24 is a means for causing relative movement between the surface of the wafer 20 and the polishing member 22. The method of causing relative movement can be thought of as follows. For example, the housing member 10 or the pressing member 12 and the polishing member 22 are relatively rotated or moved reciprocatingly. For instance, the driving means 24 consists of a holding member (not shown) to hold the housing member 10 or the pressing member 12 and the power source supplying the force to move the holding members.

According to the first mode of this invention, because the fluid is housed with a piston structure the polishing apparatus which utilizes Pascal's principle can be constructed with a simple structure.

Moreover, where the inner diameter of the housing member 10 is formed larger than the diameter of the wafer 20, the pressure is applied uniformly to the whole surface of the wafer 20. As a result a desirable surface can be obtained.

(The Second Mode)

Figure 2:
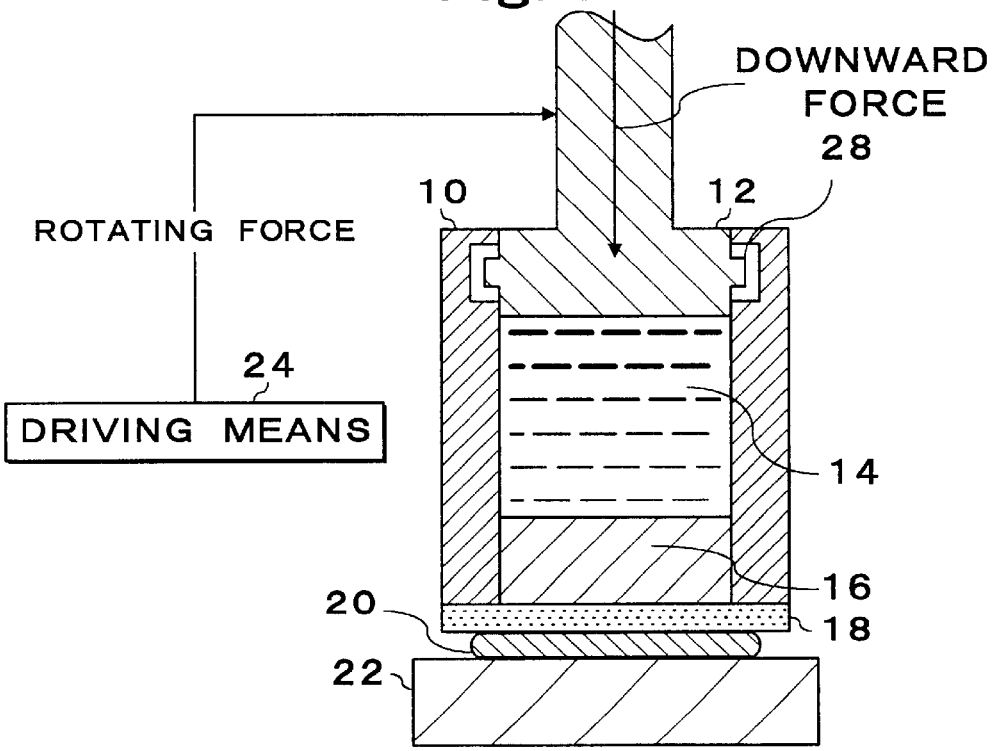
FIG. 2 is a conception diagram which shows the construction of the apparatus for polishing a semiconductor wafer in accordance with the second mode of this invention.

FIG. 2 is a conception diagram which shows the construction of the apparatus for polishing a semiconductor wafer in accordance with the second mode of this invention. As shown in this figure, the apparatus for polishing a semiconductor wafer in accordance with the second mode of this invention applies the rotating force from the driving means 24 to the pressing member 12 to rotate the wafer 20 about its own axis, and polishes the surface of the wafer 20.

The engagement portion 28 in which the pressing member 12 engages with the housing member 10 is further provided in the second mode of this invention in addition to the construction of the first mode. This engagement portion 28 is constructed in combination with a convexity formed on a part of the pressing member 12 and a concavity formed on the housing member 10 which is arranged corresponding to the location of the convexity. This convexity is made smaller than the concavity so that when they are engaged the pressing member 12 can slide and yet the fluid 14 cannot leak outside.

The engagement portion 28 transmits the rotating force from the pressing member 12 to the housing member 10. The wafer 20 rotates together with the housing member 10.

According to the second mode of this invention, the surface of the wafer 20 can be polished uniformly and rapidly because the wafer 20 is rotated about its own axis while being pressed at the uniform pressure, (The Third Mode)

Figure 3:
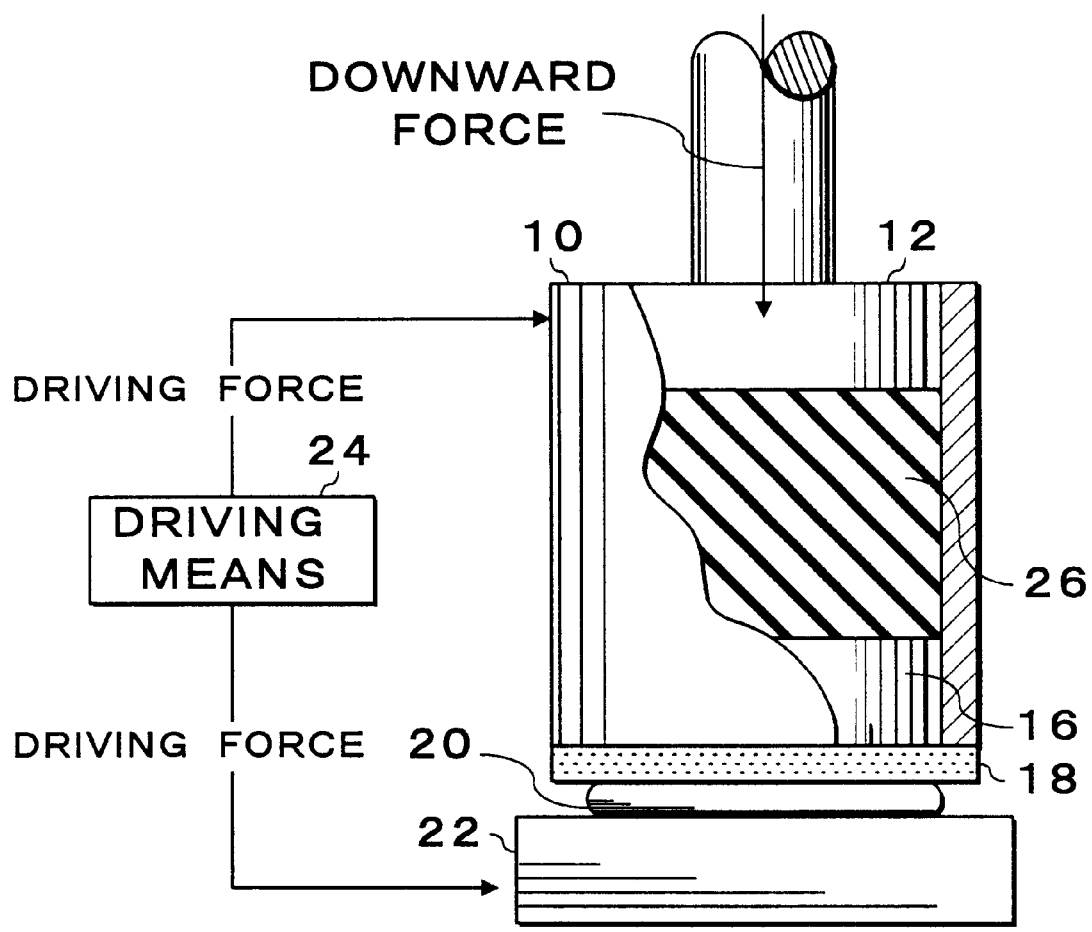
FIG. 3 is a conception diagram which shows the construction of the apparatus for polishing a semiconductor wafer in accordance with the third mode of this invention.

FIG. 3 is a conception diagram which shows the construction of the apparatus for polishing a semiconductor wafer in accordance with the third mode of this invention. In the apparatus for polishing a semiconductor wafer according to the third mode of this invention, an elastic member 26 is provided in place of the fluid 14 provided in the first mode. The elastic member 26 works based on Pascal's principle.

It is desirable to use an elastic member which has characteristics similar to that of the fluid 14, such as a silicon rubber which is cured at the room temperature. More preferably, the elastic member having a hardness of Hs 40–60 on JISA is used as the elastic member 26. Where the elastic member 26 has the hardness enough not to leak outside, the elastic member 26 need not be strictly sealed up because the resistance between the pressing member 12 and the housing member 10 becomes almost infinite.

The polishing apparatus in the third mode in which the elastic member is used in place of the fluid can be constructed as simple in structure as the first mode of this invention.

DESCRIPTION OF THE PREFERRED EMBODIMENT

Figure 4:
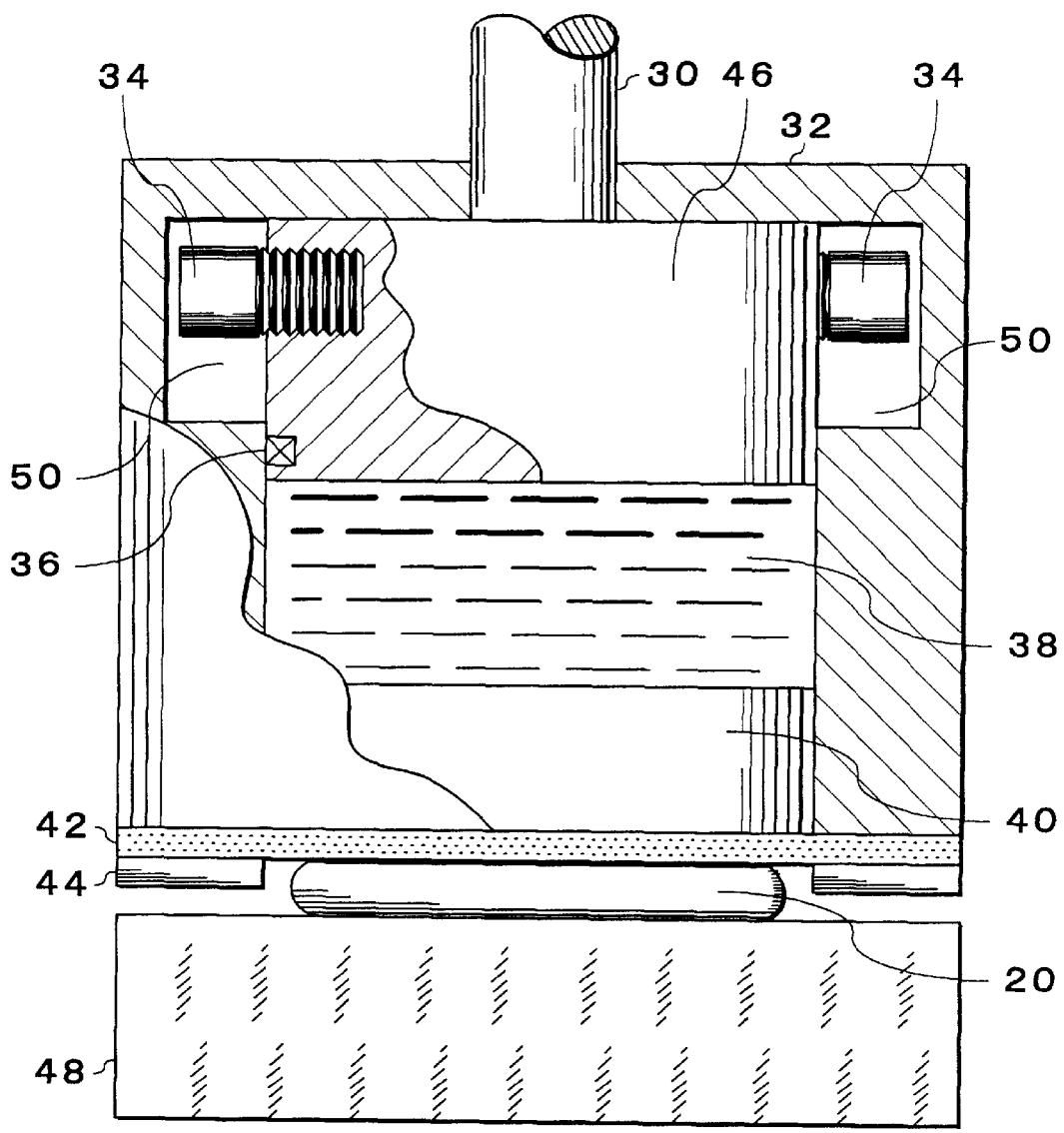
FIG. 4 is a fragmentary sectional view which shows a referred structure of the apparatus for polishing a semiconductor wafer in accordance with this invention.

FIG. 4 is a fragmentary sectional view which shows a referred structure of the apparatus for polishing a semiconductor wafer in accordance with an embodiment of this invention. As shown in this figure, an apparatus for polishing a semiconductor wafer according to this embodiment consists of a rotation axis 30, a piston 46 which is fixed to the bottom end of the rotation axis 30, a ceramic plate 40 which is oppositely arranged against the piston 46, a silicone gel 38 which is filled between the piston 46 and the ceramic plate 40, a cylinder 32 which houses these components, a backing pad 42 which is fixed to the bottoms of the ceramic plate 40 and the cylinder 32, a template 44 which is arranged on the peripheral portion of the backing pad 42, and a polishing cloth 48 which polishes the surface of the wafer 20.

As shown in this figure, a space 50 is formed in the inner wall of the cylinder 32 corresponding to the location where a bolt 34 is buried in the periphery of the piston 46. This space 50 has the height enough to compress the silicone gel 38 and is lower than the height of the piston 46 so that the silicone gel 38 does not leak outside. The bolt 34 and the space 50 provide the loose engagement of the piston 46 and the cylinder 32.

In order to seal up the silicone gel 38, a piston ring 36 is arranged at the lower periphery of the piston 46. Another piston ring 36 is also arranged on the periphery of the ceramic plate 40. The silicone gel 38 is filled within the sealed space formed in the cylinder 32.

The rear surface of the wafer 20 is attached at the center of the backing pad 42, and the surface to be polished of the wafer 20 is contact with the surface of the polishing cloth 48.

Hereafter, the example of the action of the polishing apparatus constructed in the above-mentioned manner is explained.

First of all, the wafer 20 is set in the polishing apparatus. Afterwards, the polishing liquid is supplied to the portion where the wafer 20 is contacted with the polishing cloth 48.

Next, the rotation axis 30 is rotated so that the wafer 20 is rotated about its own axis. Then the silicone gel 38 is compressed by applying the downward force to the rotation axis 30 while the wafer 20 rotates at a desired speed. According to Pascal's principle, the pressure applied to the silicone gel 38 uniformly distributes, and becomes the uniform force by which the surface of the wafer 20 is evenly pressed.

Then, the wafer 20 is rotated for a fixed time while being pressed by the uniform force.

Finally, the downward force and the rotation force applied to the rotation axis 30 are released, and the wafer 20 whose surface has been polished is removed from the backing pad 42. Then, another unpolished wafer is set in the polishing apparatus.

A great number of wafers are continuously polished by repeating the above-mentioned operation.

This invention may be embodied in other specific forms without departing from the spirit or essential characteristics thereof. The present embodiment is therefore to be considered in all respects as illustrative and not restrictive, the scope of this invention being indicated by the appended claims rather than by the foregoing description and all changes which come within the meaning and range of equivalency of the claims are therefore intended to be embraced therein.

What is claimed is:

1. An apparatus for polishing a semi-conductor wafer, comprising:
    a housing member which maintains a fluid in a sealed condition;
    a shaft;
    a pressing member fixedly connected to said shaft which presses the fluid while maintaining the sealed condition of the housing member by application forces to the shaft, said pressing member capable of movement related to said housing member;
    an engaging means for engaging the pressing member with the housing member;
    a supporting member on a lower end of said housing member which faces the pressing member so as to sandwich the fluid, and which receives on an entire surface of one side thereof pressure from the fluid thereby causing said housing member and supporting member to move downwardly and press the semiconductor wafer located on the opposite side thereof; and
    a polishing member which faces the supporting member so as to sandwich the semiconductor wafer, and which polishes a surface of the semiconductor wafer.

2. An apparatus for polishing a semiconductor wafer as claimed in claim 1, wherein the housing member has an inner diameter which is larger than a diameter of the semiconductor wafer.

3. An apparatus for polishing a semiconductor wafer as claimed in claim 1, further comprising driving means for rotating relatively the semiconductor wafer held on the polishing member.

4. An apparatus for polishing a semiconductor wafer as claimed in claim 3, wherein the driving means supplies a rotation force to the pressing member to rotate the pressing member about its own axis.

5. An apparatus for polishing a semiconductor wafer as claimed in claim 1, wherein the fluid is a silicone oil.

6. An apparatus for polishing a semiconductor wafer as claimed in claim 5, wherein the silicone oil has a viscosity of 10–1,000 cst.

7. An apparatus for polishing a semiconductor wafer as claimed in claim 1, wherein the fluid is a liquid silicone rubber.

8. An apparatus for polishing a semiconductor wafer as claimed in claim 7, wherein the liquid silicone rubber has a viscosity of 1,000–8,000 poise.

9. An apparatus for polishing a semiconductor wafer, comprising:
    a housing member which houses an elastic member;
    a shaft;
    a pressing member fixedly secured to said shaft which presses the elastic member in the housing member by the application of a force to said shaft;
    a supporting member which faces the pressing member so as to sandwich the elastic member, and which receives on an entire surface of one side thereof a elastic force of the elastic member and presses the semiconductor wafer located on the side of the other one side thereof; and
    a polishing member which faces the supporting member so as to sandwich the semiconductor wafer, and which polishes a surface of the semiconductor wafer.

10. An apparatus for polishing a semiconductor wafer as claimed in claim 9, wherein the housing member has an inner diameter which is larger than a diameter of the semiconductor wafer.

11. An apparatus for polishing a semiconductor wafer as claimed in claim 9, further comprising driving means for rotating relatively the semiconductor wafer held on the wafer holding member and the polishing member.

12. An apparatus for polishing a semiconductor wafer as claimed in claim 11, further comprising an engagement means for engaging the pressing member engages with the housing member, wherein the driving means supplies a rotation force to the pressing member to rotate the pressing member about its own axis.

13. An apparatus for polishing a semiconductor wafer as claimed in claim 9, wherein the elastic member is a silicone rubber.

14. An apparatus for polishing a semiconductor wafer as claimed in claim 13, wherein the silicone rubber has a hardness of Hs 40–60.

* * * * *